United States Patent [19]

Zinck et al.

[11] Patent Number: 5,454,902

[45] Date of Patent: Oct. 3, 1995

[54] PRODUCTION OF CLEAN, WELL-ORDERED CDTE SURFACES USING LASER ABLATION

[75] Inventors: Jennifer J. Zinck, Calabasas; Peter D. Brewer, Newbury Park, both of Calif.

[73] Assignee: Hughes Aircraft Company, Los Angeles, Calif.

[21] Appl. No.: 951,925

[22] Filed: Sep. 24, 1992

Related U.S. Application Data

[63] Continuation-in-part of Ser. No. 790,947, Nov. 12, 1991, abandoned.

[51] Int. Cl.[6] .................................................. H01L 21/00
[52] U.S. Cl. .................... 216/65; 156/643.1; 156/651.1; 252/79.1; 219/121.61; 219/121.68; 219/121.69; 219/121.85; 372/109; 204/192.35; 216/66
[58] Field of Search ..................... 156/643, 651, 156/656; 252/79.1; 219/121.85, 121.61, 121.68, 121.69; 372/109; 204/192.35; 134/1, 902; 437/225, 247, 233, 234

[56] References Cited

U.S. PATENT DOCUMENTS

| | | | |
|---|---|---|---|
| 4,927,773 | 5/1990 | Jack et al. | 437/37 X |
| 5,018,164 | 5/1991 | Brewer et al. | 372/109 |

FOREIGN PATENT DOCUMENTS 0423463  4/1991  European Pat. Off. .

OTHER PUBLICATIONS

Brewer et al, "Reversible Modification of CdTe Surface Composition by Excimer Laser Irradiation", Appl. Phys. Lett. (USA), vol. 57, No. 24, pp. 2526–2528, 10 Dec. 1990, 15 REF (Abstract).

Journal of Crystal Growth, vol. 59, No. 1/2, Sep. 1982, Amsterdam Nl, pp. 130–134, Roussille, et al., "Growth of high quality eptaxial CdxHgl–xTe films by sputter deposition".

Week 8504, Nov. 29, 1984, Derwent Publications Ltd., London GB; AN85–018687 & AU, A, 1 859 783 (Katz B.B.) Abstract.

Journal of Soviet Laser Research vol. 6, No. 4, Jul. 1985, New York, pp. 395–404, Bertolottie, "Laser annealing of semiconductors".

J. J. Zinck et al. "Surface Chemistry of Te–Rich CdTe", Material Research Symposium Proc., vol. 204, 1991, pp. 243–250.

*Primary Examiner*—Thi Dang
*Attorney, Agent, or Firm*—V. D. Duraiswamy; Wanda Denson-Low

[57] ABSTRACT

Chemically-etched and or sputtered CdTe surfaces are exposed to UV excimer laser radiation at a fluence ranging from about 15 to 75 $mJ/cm^2$, followed by either a low temperature (<300° C.) thermal anneal or exposure of the CdTe surface to UV excimer laser radiation at a fluence lower than the threshold fluence. This procedure provides clean, stoichiometric, and well-ordered CdTe surfaces.

24 Claims, 1 Drawing Sheet

PRODUCTION OF CLEAN, WELL-ORDERED CDTE SURFACES USING LASER ABLATION

This is a continuation-in-part of application Ser. No. 07/790,947, filed Nov. 12, 1991, now abandoned.

BACKGROUND OF THE INVENTION

1. Field of the Invention

The present invention relates to the production of clean, stoichiometric, and well-ordered CdTe surfaces for the purpose of subsequent growth and/or processing of II-VI materials.

2. Description of Related Art

Cadmium telluride (CdTe) is a desirable substrate for mercury-based II-VI alloy and superlattice growth because of its close lattice match to HgTe and therefore to all HgCdTe alloy compositions. As is well-known, HgCdTe alloy composites are widely used as infrared detectors.

The performance of HgCdTe infrared detectors depends strongly upon the structural and chemical properties of the HgCdTe sensing layer, which in turn depends on the quality of the underlying substrate.

However, CdTe substrates are typically not available in the same high quality as GaAs or Si. In addition, wet chemical etching of a CdTe surface leads to non-stoichiometric, atomically rough surfaces which make poor templates for subsequent growth. The state of the CdTe surface following etching may vary considerably from substrate to substrate, because the CdTe surface appears to be extremely sensitive to the parameters of etching used during etching; these parameters include etchant concentration, temperature, time, and agitation. There are numerous conflicting reports in the technical literature regarding the stoichiometry and composition CdTe surfaces which were reported to have been subjected to the same etching procedures. Therefore, an additional treatment is required to produce a stoichiometric and ordered surface prior to the growth of HgCdTe.

There are several ways of improving the poor quality of the CdTe substrate surfaces which result from wet chemical etching. It is possible, for example, to remove contaminants from the CdTe surface by ion bombardment, followed by a thermal anneal to remove the sputter damage. Contaminants such as carbon, oxygen, chlorine, and sulfur result from exposure of the substrate surface to the ambient. Sputter damage is well-known to occur during sputtering.

We attempted to prepare a CdTe (100) substrate using very mild sputtering conditions (100 eV Ar ions at <100 MA/cm$^2$ beam current density for 5 minutes), followed by a 5 minute anneal at 300° C. Auger measurements indicated that following this treatment, the surface was clean and stoichiometric. However, RHEED (reflection high-energy electron diffraction) analysis was spotty and indicative of rough surface morphology.

Alternately, it is common to grow a CdTe buffer layer on top of the CdTe substrate in an attempt to bury defects and impurities at the substrate-buffer layer interface. However, the quality of the buffer layer can also be affected by the presence of impurities and roughness on the substrate. Improvements in the quality of the substrate will result in improved buffer layer properties.

In a previous publication which includes the present inventors as authors, it was shown that compositional deviations from stoichiometry of a (100) CdTe surface resulting from exposure to 248 nm (KrF) excimer laser radiation were reversible under appropriate fluence conditions. However, improving the stoichiometry does not necessarily result in improvement of the surface structure of the CdTe substrate.

A process which improves the quality of the CdTe substrate, and hence the interface between the substrate and HgCdTe layer epitaxially grown thereon, would greatly improve the performance and reliability of the infrared detectors.

SUMMARY OF THE INVENTION

In accordance with the invention, a method is provided for producing clean, stoichiometric and well-ordered CdTe surfaces. The method involves removing damage caused by chemical etching and/or sputter-cleaning by the exposure of a chemically-etched and/or sputter cleaned pulses of CdTe surface to UV radiation at a fluence ranging from about 15 mJ/cm$^2$, which removes about 0.1 Å of damaged layer per pulse, to about 75 mJ/cm$^2$ which removes about 20 Å of damaged layer per pulse. The damage-free surface is then treated to provide a stoichiometric surface that evidences long range crystalline symmetry by either exposure of the CdTe surface to UV excimer laser radiation at a fluence lower than the threshold fluence or a low temperature (<300° C.) thermal anneal.

The resultant surface in either case is clean and stoichiometric, as determined by Auger electron spectroscopy and is well-ordered as indicated by reflection high-energy electron diffraction (RHEED).

DESCRIPTION OF THE PREFERRED EMBODIMENTS

A method for producing clean, stoichiometric and well-ordered CdTe surfaces is provided. The method comprises:

(a) providing a CdTe substrate having a surface region that has been exposed to at least one of chemical etching and sputter-cleaning to cause damage in the surface region;

(b) removing the damage by exposing the substrate to pulses of ultraviolet radiation at a fluence ranging from about 15 mJ/cm$^2$, which removes about 0.1 Å of damaged layer per pulse, to 75 mJ/cm$^2$ which removes about 20 Å of damaged layer per pulse; and (c) treating the surface to provide a stoichiometric CdTe surface that evidences long range crystalline symmetry by performing either one of the following steps:

(1) exposing the CdTe surface to ultraviolet radiation at a fluence lower than the threshold fluence, or (2) thermally annealing the CdTe surface at a temperature less than about 300° C. until any excess tellurium is removed.

The UV radiation useful in the practice of the invention is related to the bandgap of CdTe. Specifically, the process of the invention may be performed with any radiation the energy of which is equal to or greater than the bandgap energy, which, for CdTe, is about 1.5 eV. This translates into a wavelength of less than about 827 nm.

Preferably, the UV radiation is one that is easily accessible; for example a KrF excimer laser operating at about 248 nm is desirably employed in the practice of the invention, although other sources of UV radiation may alternatively be used, having the appropriate fluence, which is discussed in greater detail below. Another useful UV wavelength that may be employed is at about 193 nm.

The CdTe surface is first exposed to a wet chemical etch. The wet chemical etching desirably employs a solution of bromine in ethylene glycol, although any etchant that etches CdTe may alternatively be employed such as bromine in methanol. Preferably, at most $1/16\%$ weight/weight $Br_2$/ethylene glycol or $1/16\%$ $Br_2$/methanol is employed, as this seems to provide the most control; stronger solutions result in greater damage to the surface region. Residual carbon contamination of the surface may be removed by sputter-cleaning at this point in the process. Alternatively, the sputter cleaning may be performed in place of the wet chemical etching. However, sputter-cleaning leaves the surface roughened, as characterized by a spotty RHEED pattern, even after thermal annealing at 300° C.

The optional sputter-cleaning following the chemical etch employs very mild conditions. For example, argon ions having an energy of about 50 to 100 eV are utilized, using a beam current density of less than about 100 $\mu A/cm^2$ for a period of time ranging from about 1 to 5 minutes.

In step (c1), the fluence is preferably at least about 60 $mJ/cm^2$. However, the fluence should not exceed about 75 $mJ/cm^2$, in order to avoid melting of the CdTe surface.

Figure 1:
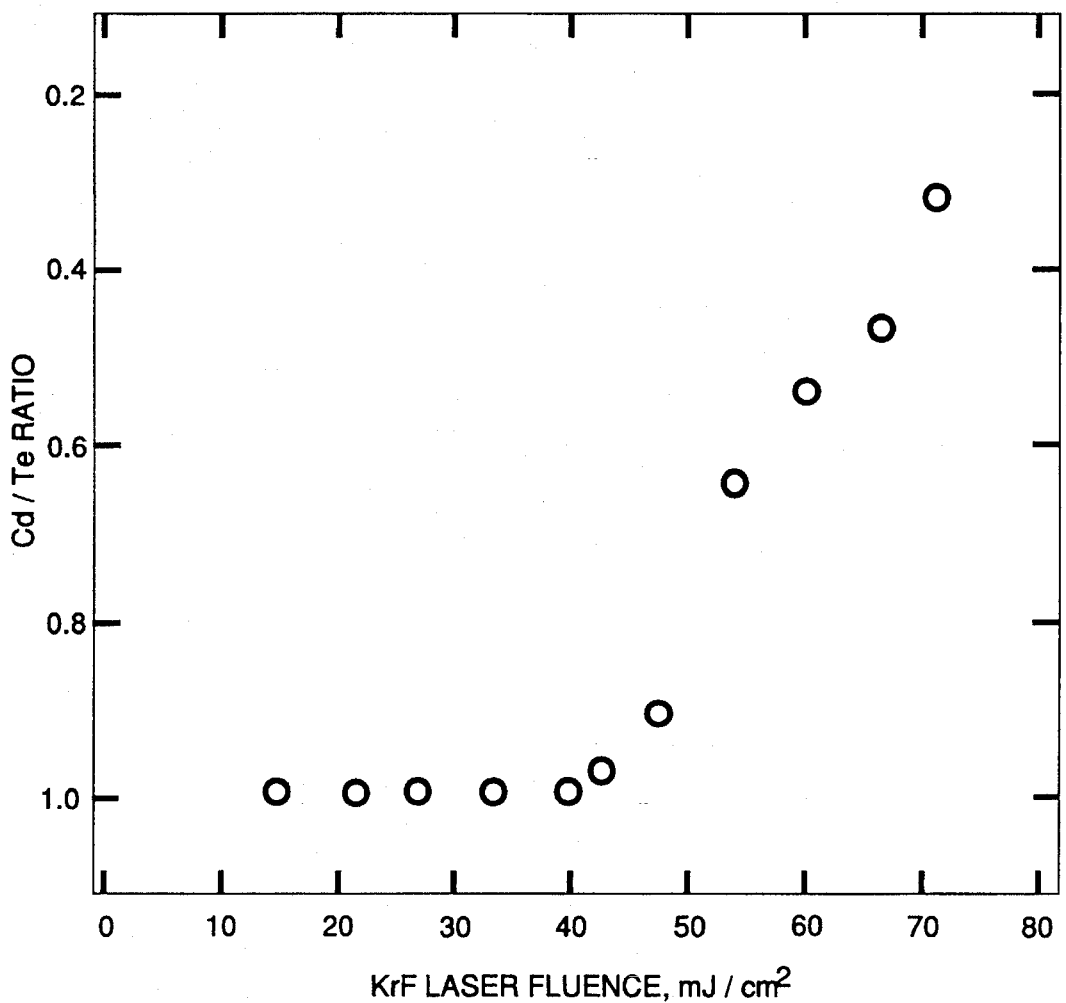
FIG. 1, on coordinates of Cd:Te ratio and fluence (in mJ/cm$^2$) is a plot of CdTe stoichiometry as a function of KrF (248 nm) laser fluence.

In step (c2), the fluence is preferably no greater than about 40 $mJ/cm^2$. The existence of a threshold fluence (about 40 $mJ/cm^2$) above which the CdTe surface stoichiometry is altered is shown in FIG. 1. The fluence should be at least about 15 $mJ/cm^2$ in order to realize the benefits of the invention.

The repetition rate of the excimer laser is not critical to the practice of the invention, so long as the sample is heat-sunk, to avoid bulk heating of the CdTe sample, and may be at any value that is conveniently accessible. For example, the repetition rates of the excimer laser used herein in both cases ranged from about 0.5 to 1 Hz. Even higher repetition rates may also be employed.

Damage near the CdTe surface region caused by one or both of wet chemical etching and sputter-cleaning is removed by exposing the surface region to pulses of UV radiation at a fluence ranging from about 15 to 75 $mJ/cm^2$. The number of laser pulses is a function of the fluence; a fluence of 15 $mJ/cm^2$ removes about 0.1 Å of damaged layer, while a fluence of 75 mJ removes about 20 Å of damaged layer. The total number of pulses required depends on the fluence employed and the extent of damage in the CdTe surface. For example, a mild chemical etch of $1/16\%$ bromine in ethylene glycol produces damage in about the first several hundred Å below the CdTe surface. At a fluence of about 60 $mJ/cm^2$, about 50 pulses are required to remove the damage. At a fluence of about 15 $mJ/cm^2$, the number of pulses required to remove the damage is about 50,000. Greater damage would require an even higher number of pulses.

In treating the CdTe surface to return it to stoichiometry by exposure to UV radiation at a fluence less than about 40 $mJ/cm^2$, the number of pulses desirably ranges from about 100 to several thousand. However, it should be recognized that if the fluence chosen to remove the etch and/or sputter damage is less than the threshold voltage of about 40 $mJ/cm^2$, then the resulting surface is already stoichiometric and well-ordered, and step (c1) is not necessary, being subsumed within step (b). The trade-off is the large number of pulses required at this lower fluence, which makes removal of the damage at a fluence greater than the threshold fluence desirable from a processing standpoint.

In step (c2), the CdTe surface is exposed to the temperature for a period of time ranging from about 30 seconds to 5 minutes and then cooled to room temperature. For example, the sample may be heated in a furnace (or the surface exposed to a source of heat), brought up to the desired surface temperature, held there for the desired period of time, and then the heat source may be shut off and the sample allowed to cool. Alternatively, the sample could be mounted on a cold stage such as a liquid nitrogen cooled stage, the nature of the surface monitored such as by RHEED analysis during heating, and then cooled to room temperature when the surface achieves crystalline order.

While the annealing temperature is less than about 300° C. in order to avoid thermal pitting of the CdTe surface, preferably, the annealing temperature is about 200° C. The lower limit of the annealing temperature is about 165° C., which represents the temperature at which $Te_2$ evaporation from the surface is evident, i.e., kinetically significant.

The process of the invention, which employs laser ablation, such as from a 248 nm laser, removes both the surface contaminants and the damaged layer produced by wet chemical etching, while leaving a stoichiometric and well-ordered CdTe substrate for subsequent growth and processing. By "well-ordered" is meant that the surface has long range crystalline symmetry to the resolution observable by RHEED.

The present invention deals with the reversibility of structure, as compared with the reversibility of composition, for CdTe surfaces. Although compositional reversibility can be observed even if the surface is not clean and even if it is damaged, much more stringent requirements on surface preparation are required if the structural reversibility is to be achieved.

Most processing steps take the CdTe surface through a wet etching procedure, which removes a surface oxide, but leaves carbon contamination on the surface and etch damage to a depth which is determined by the concentration of the etch. In order to have a good template for subsequent crystal growth, the surface must be clean and well-ordered, as defined above.

Although light sputtering can remove surface carbon, sputtering also damages the surface region. Thermal annealing alone does not satisfactorily heal this sputter damage, due to thermal etch pit formation. It is necessary to remove this damaged layer in order to obtain structural reversibility. Laser ablation can remove this damaged surface layer without heating the bulk of the material. Therefore, enough high fluence pulses must be delivered to remove the damaged layer. Estimates of the damage as a function of etchant concentration are available, and the rate at which material is removed by the laser at high fluence is also known. For example, a $1/16\%$ solution of $Br_2$ in methanol or ethylene glycol induces several hundred Å of etch damage. As indicated above, 60 $mJ/cm^2$, 50 pulses would be required to ensure removal of the damaged layer.

This distinction is an important one, because having compositional reversibility alone is insufficient to allow high quality growth or processing to proceed; an ordered surface structure is essential.

The process of the invention may be performed in situ in any chamber equipped with an ultraviolet grade optical port and is compatible with closed system processing. Laser ablation presents an advantage over alternative surface cleaning techniques such as ion bombardment because it does not require an additional piece of vacuum hardware with a hot filament which may act as an independent source of impurities.

EXAMPLES

We used CdTe (100) single crystal substrates grown by the vertical Bridgman technique and obtained from II-VI Industries, Inc. (Saxonburg, Pa.). Substrates were etched in 1/16% weight/weight $Br_2$/ethylene glycol solution. The treatment removed the native oxide. However, Auger measurements indicated that CdTe surfaces treated in this fashion were contaminated with carbon, oxygen, chlorine, and sometimes sulfur. The substrates were then sputter-cleaned to remove residual contaminants, using Ar ions at 100 eV and a beam current density of 60 $\mu A/cm^2$ for 2 minutes. RHEED patterns from these surfaces were very spotty, indicating a rough and disordered surface.

The apparatus for simultaneously exposing CdTe surfaces to a KrF excimer laser beam and for analyzing the surface by AES and RHEED has been described in *Materials Research Society Symposium*, Vol. 204, pp. 243–250 (April, 1991); see also U.S. Pat. No. 5,018,164 for a description of excimer laser ablation of CdTe films. Briefly, the system consisted of a turbomolecular-pumped stainless steel vacuum chamber with a base pressure of $5 \times 10^{-9}$ Torr. The chamber was equipped with a hemispherical analyzer and an electron gun for Auger electron spectroscopy, a cryo-shielded and differentially pumped quadrupole mass spectrometer for time-of-flight (TOF) mass spectrometry studies of desorbed product velocities, and ultraviolet grade quartz optical ports to allow excimer laser radiation of the sample. A precision manipulator with heating and cooling capabilities was used to position the sample for laser radiation and surface analysis. The KrF excimer laser radiation (15 nsec, 248 nm, 0.5 Hz) was introduced either at normal incidence or at 45° to the CdTe surface. The incident fluence was controlled by placing partial reflectors in the path of the laser beam.

Exposure of these CdTe surfaces to 50 pulses of 248 nm excimer laser radiation at fluences of about 60 to 65 $mJ/cm^2$ succeeded in removing the etch damage of the surface region but left the surface Te-rich and with no observable RHEED pattern.

Subsequent exposure of the Te-rich CdTe surface to several hundred pulses of 248 nm excimer laser radiation at fluences of 40 $mJ/cm^2$ or less left the CdTe surface clean, stoichiometric, and with a reconstructed (2×1) surface unit cell clearly observable by RHEED. The (2×1) reconstruction has been observed by others to be the stable surface structure for a clean, well-ordered CdTe (100) surface.

Figure 2A:
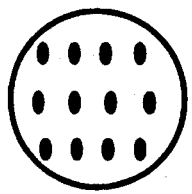
FIGS. 2a–c are line drawing representations of surfaces observable by RHEED, which schematically depict the sequence of surface structures resulting from laser ablation of the surface in accordance with the invention.
Figure 2B:
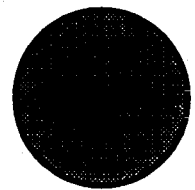
Figure 2C:
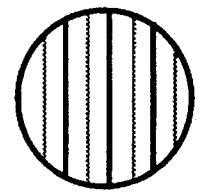

The foregoing sequence of steps is illustrated in FIGS. 2a–c. FIG. 2a depicts the spotty surface resulting either from sputter-cleaning and annealing at 300° C. or from etching in the $Br_2$/ethylene glycol etch, followed by sputter-cleaning. FIG. 2b represents the amorphous surface (no RHEED pattern) following irradiation with 50 pulses at 248 nm and a fluence of 63 $mJ/cm^2$. FIG. 2c represents the reconstructed CdTe (100) (2×1) surface obtained by irradiation with several thousand pulses at 248 nm and a fluence of 28 $mJ/cm^2$. The foregoing procedure removes excess Te and results in a clean, stoichiometric, and well-ordered CdTe substrate surface.

It was also possible to obtain the clean, well-ordered CdTe (100) surface condition by following the pulses of 248 nm excimer laser radiation at a fluence of 65 $mJ/cm^2$ with a low temperature (200° C.) thermal anneal of the substrate for 5 minutes.

RHEED patterns for a surface chemically etched and sputtered under the same conditions as described above and exposed to 50 pulses of 248 nm excimer laser radiation at 65 $mJ/cm^2$ followed by a thermal anneal at 200° C. for 5 minutes clearly showed a (2×1) reconstruction; the pattern consisted of strong uniform streaks, indicative of a smooth ordered surface.

Thus, there has been disclosed a method for producing clean, stoichiometric, well-ordered CdTe surfaces. It will be readily apparent to those skilled in this art that various changes and modifications of an obvious nature may be made without departing from the spirit of the invention, and all such changes and modifications are considered to fall within the scope of the invention, as defined by the appended claims.

What is claimed is:

1. A method for producing clean, stoichiometric, and well-ordered CdTe surfaces, comprising:
   (a) providing a CdTe substrate having a surface region that has been exposed to at least one of chemical etching and sputter-cleaning to cause damage in said surface region;
   (b) removing said damage by exposing said substrate to ultraviolet radiation at a fluence ranging from about 15 $mJ/cm^2$, which removes about 0.1 Å of damaged layer per pulse, to about 75 $mJ/cm^2$, which removes about 20 Å of damaged layer per pulse;
   (c) treating said surface to provide a stoichiometric CdTe surface that evidences long range crystalline symmetry by performing either one of the following steps:
      (1) exposing said CdTe surface to ultraviolet radiation at a fluence lower than the threshold fluence for creating a non-stoichiometric film, or
      (2) thermally annealing said CdTe surface at a temperature less than about 300° C. until any excess tellurium is removed.

2. The method of claim 1 wherein said CdTe surface is chemically etched in a solution consisting essentially of bromine in either ethylene glycol or methanol.

3. The method of claim 2 wherein the concentration of bromine in either ethylene glycol or methanol is at most about 1/16% weight/weight.

4. The method of claim 1 wherein said sputter-cleaning is performed employing argon ions at an energy of about 50 to 100 eV, using a beam current density of less than about 100 $\mu A/cm^2$ for a period of time ranging from about 1 to 5 minutes.

5. The method of claim 1 wherein said UV radiation is provided by a source comprising an excimer laser operating in the range of about 193 to 248 nm.

6. The method of claim 5 wherein said UV excimer laser is a KrF laser operating at about 248 nm.

7. The method of claim 6 wherein said damage is removed by exposing said surface to UV radiation at a fluence of at least about 60 $mJ/cm^2$.

8. The method of claim 1 wherein said damage is removed by exposing said surface to UV radiation at a fluence of less than about 40 $mJ/cm^2$.

9. The method of claim 6 wherein said CdTe surface is exposed to said UV excimer laser for about 100 to several thousand pulses.

10. The method of claim 6 wherein said threshold fluence for creating a non-stoichiometric film is about 40 mJ/cm$^2$.

11. The method of claim 10 wherein said step of treating said surface is performed at a fluence of at least about 15 mJ/cm$^2$.

12. The method of claim 11 wherein said CdTe surface is exposed to said UV excimer laser for about 100 to several thousand pulses.

13. The method of claim 1 wherein said CdTe surface is exposed to said temperature for a period of time ranging from about 30 seconds to 5 minutes and then cooled to room temperature.

14. The method of claim 13 wherein said annealing temperature is less than about 200° C.

15. The method of claim 1 wherein said CdTe surface is first chemically etched and then sputter-cleaned.

16. A method for producing clean, stoichiometric, and well-ordered CdTe surfaces, comprising:
   (a) providing a CdTe substrate having a surface region that has been exposed to at least one of chemical etching and sputter-cleaning to cause damage in said surface region;
   (b) removing said damage by exposing said substrate to ultraviolet radiation from an excimer laser operating in the range of about 193 to 248 nm at a fluence ranging from about 15 mJ/cm$^2$, which removes about 0.1 Å of damaged layer per pulse, to about 75 mJ/cm$^2$, which removes about 20 Å of damaged layer per pulse; and
   (c) treating said surface to provide a stoichiometric CdTe surface that evidences long range crystalline symmetry by performing either one of the following steps:
      (1) exposing said CdTe surface to ultraviolet radiation from said excimer laser at a fluence from about 15 to less than 40 mJ/cm$^2$, or
      (2) thermally annealing said CdTe surface at a temperature less than about 300° C. until any excess tellurium is removed.

17. The method of claim 16 wherein said CdTe surface is chemically etched in a solution consisting essentially of bromine and ethylene glycol, in which the concentration of bromine in ethylene glycol is at most about 1/16% weight/weight.

18. The method of claim 16 wherein said UV excimer laser is a KrF laser operating at about 248 nm.

19. The method of claim 16 wherein said CdTe surface is exposed to said UV excimer laser at a fluence of at least about 60 mJ/cm$^2$.

20. The method of claim 16 wherein said CdTe surface is exposed in step (c1) to said UV excimer laser for about 100 to several thousand pulses.

21. The method of claim 16 wherein said CdTe surface is exposed to said temperature for a period of time ranging from about 30 seconds to 5 minutes and then cooled to room temperature.

22. The method of claim 21 wherein said annealing temperature is less than about 200° C.

23. The method of claim 16 wherein said CdTe surface is first chemically etched and then sputter-cleaned.

24. The method of claim 16 wherein said sputter-cleaning is performed employing argon ions at an energy of about 50 to 100 eV, using a beam current density of less than about 100 μA/cm$^2$ for a period of time ranging from about 1 to 3 minutes.

* * * * *